United States Patent
Oono et al.

(10) Patent No.: US 10,253,729 B2
(45) Date of Patent: Apr. 9, 2019

(54) COOLING MODULE

(71) Applicant: DENSO CORPORATION, Kariya, Aichi-pref. (JP)

(72) Inventors: Shingo Oono, Kariya (JP); Tomohiro Shimazu, Kariya (JP); Yasuhiro Mizuno, Kariya (JP); Ryohei Tomita, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 15/520,486

(22) PCT Filed: Nov. 13, 2015

(86) PCT No.: PCT/JP2015/005683
§ 371 (c)(1),
(2) Date: Apr. 20, 2017

(87) PCT Pub. No.: WO2016/079970
PCT Pub. Date: May 26, 2016

(65) Prior Publication Data
US 2017/0314515 A1    Nov. 2, 2017

(30) Foreign Application Priority Data

Nov. 20, 2014 (JP) .................................. 2014-235448
Jun. 15, 2015 (JP) .................................. 2015-120462

(51) Int. Cl.
*F02M 26/32*    (2016.01)
*F01P 3/18*    (2006.01)
(Continued)

(52) U.S. Cl.
CPC .............. *F02M 26/32* (2016.02); *F01P 3/18* (2013.01); *F02B 29/0462* (2013.01);
(Continued)

(58) Field of Classification Search
CPC . H01L 23/051; H01L 23/427; H01L 23/4334; H01L 23/473; H01L 24/33;
(Continued)

(56) References Cited

U.S. PATENT DOCUMENTS

| | | | | |
|---|---|---|---|---|
| 4,500,904 A | * | 2/1985 | Onuki | H01L 23/051 257/746 |
| 5,016,083 A | * | 5/1991 | Ishii | H01L 23/3738 257/713 |
| 6,992,383 B2 | * | 1/2006 | Mamitsu | H01L 23/051 257/718 |

(Continued)

FOREIGN PATENT DOCUMENTS

| | | |
|---|---|---|
| JP | 2011159862 A | 8/2011 |
| JP | 2012178513 A | 9/2012 |
| JP | 2013098387 A | 5/2013 |
| JP | 2015153869 A | 8/2015 |

*Primary Examiner* — Tho V Duong
(74) *Attorney, Agent, or Firm* — Harness, Dickey & Pierce, P.L.C.

(57) ABSTRACT

A cooling module has a heat generating body, a heat exchanger made of metal, and an insulating plate. The heat generating body has a heat dissipating surface. The heat exchanger has cooling surface facing the heat dissipating surface. The insulating plate has a first surface and a second surface. The insulating plate is interposed between the heat dissipating surface and the cooling surface on a condition that the insulating plate faces the heat dissipating surface and that the second surface faces the cooling surface. The insulating plate and the cooling surface are joined to be one body by a joining material. The heat dissipating surface and the insulating plate are in close contact with each other through an elastic member. The heat dissipating surface and the cooling surface are thermally connected to each other through the joining material, the insulating plate, and the elastic member.

11 Claims, 3 Drawing Sheets

(51) Int. Cl.
  *F02B 29/04*    (2006.01)
  *F28F 21/00*    (2006.01)
  *H01L 23/36*    (2006.01)
  *H01L 23/433*   (2006.01)
  *H01L 23/473*   (2006.01)

(52) U.S. Cl.
  CPC .............. *F28F 21/00* (2013.01); *H01L 23/36* (2013.01); *H01L 23/4334* (2013.01); *H01L 23/473* (2013.01); *H01L 2224/33* (2013.01); *H01L 2924/181* (2013.01); *Y02T 10/146* (2013.01)

(58) Field of Classification Search
  CPC ........ H01L 25/072; H01L 2924/13055; F02M 26/32; F01P 3/18; F02B 29/0462; F28F 21/00
  See application file for complete search history.

(56) References Cited

U.S. PATENT DOCUMENTS

| | | | |
|---|---|---|---|
| 8,299,606 B2* | 10/2012 | Mori | H01L 23/3735 257/706 |
| 8,450,845 B2* | 5/2013 | Ikeda | H01L 23/3735 257/712 |
| 2002/0113302 A1 | 8/2002 | Shinohara | |
| 2004/0144996 A1* | 7/2004 | Inoue | H01L 23/4006 257/200 |
| 2006/0021734 A1* | 2/2006 | Chang | H01L 21/4882 165/80.3 |
| 2007/0216013 A1* | 9/2007 | Funakoshi | H01L 23/3735 257/691 |
| 2010/0140655 A1* | 6/2010 | Shi | H01L 33/507 257/99 |

* cited by examiner

COOLING MODULE

CROSS REFERENCE TO RELATED APPLICATIONS

This application is a U.S. National Phase Application under 35 U.S.C. 371 of International Application No. PCT/JP2015/005683 filed on Nov. 13, 2015 and published in Japanese as WO 2016/079970 A1 on May 26, 2016. This application is based on and claims the benefit of priority from Japanese Patent Application No. 2014-235448 filed on Nov. 20, 2014 and Japanese Patent Application No. 2015-120462 filed on Jun. 15, 2015. The entire disclosures of all of the above applications are incorporated herein by reference.

TECHNICAL FIELD

The present disclosure relates to a cooling module in which a cooling surface of a heat exchanger and a heat dissipating surface of a heat generating body are thermally connected to each other via an insulating plate.

BACKGROUND ART

The cooling module generally includes a heat generating body having one surface as a heat dissipating surface, a heat exchanger having one surface as a cooling surface opposite to the heat dissipating surface, an insulating plate interposed between the heat dissipating surface and the cooling surface and having an electrical insulation property and thermal conductivity, and heat dissipating grease.

Here, heat generated in the heat generating body is exchanged between the heat dissipating surface and the cooling surface through the insulating plate, and thereby is radiated to the heat exchanger. Further, in general, heat dissipating grease is interposed in a space between the cooling surface and the insulating plate and in a space between the heat dissipating surface and the insulating plate. Therefore, the cooling surface and the insulating plate are in close contact with each other, and the heat dissipating surface and the insulating plate are in close contact with each other, so that they are thermally connected to each other to be capable of performing the above-described heat exchange.

However, in this configuration, there is a possibility that the thermal resistance deteriorates since an abnormality such as a decrease of adhesion of the heat dissipating grease may occur due to the power cycle.

On the other hand, a joining between the cooling surface and the insulating plate and a joining between the heat dissipating surface and the insulating plate are made by a joining using Cu, Ag, etc. or a metallic joining such as brazing, and thereby a cooling module is provided with high thermal conductivity and insulation function (refer to Patent Literature 1).

PRIOR ART LITERATURES

Patent Literature

Patent Literature 1: JP 2013-98387 A

SUMMARY OF INVENTION

According to the studies by the inventors of the present disclosure, in the case of the cooling module described in Patent Literature 1, connection of the insulating plate is made to both the cooling surface of the heat exchanger and the heat dissipating surface of the heat generating body by joining using metal. In this case, a stress caused due to heat generation based on the difference in the linear expansion coefficient, i.e. a thermal stress is generated between metals configuring the respective portions of the cooling surface, heat dissipating surface and joining metal and the ceramics constituting the insulating plate. The damage caused by the stress is large in an insulating plate having a low linear expansion coefficient, and may cause a breakage of the insulating plate in the worst case.

Therefore, when the configuration of the cooling module described in Patent Literature 1 is employed, at least a part of the heat exchanger including the cooling surface, joining metal, insulating plate, joining metal and heat generating body is further required to be enclosed by a mold resin. Accordingly, an abnormality, e.g., that it is difficult to exchange only the heat generating body occurs, e.g., when the heat generating body is damaged.

The present disclosure addresses the above-described issues, and it is an object of the present disclosure to provide a cooling module capable of achieving a reduction of stress generated in the insulating plate by difference of the thermal expansion, and a reduction of deterioration of the thermal resistance at the thermally connected portion while ensuring the insulating property between the cooling surface and the heat dissipating surface when a cooling surface of the heat exchanger and a heat dissipating surface of the heat generating body are thermally connected via an insulating plate.

A cooling module of the present disclosure has a heat generating body, a heat exchanger, and an insulating plate.

At least one surface of the heat generating body is a heat dissipating surface. The heat exchanger is made of metal. At least one surface of the heat exchanger is a cooling surface facing the heat dissipating surface. The insulating plate has a first surface and a second surface as a front surface and a rear surface. The insulating plate is interposed between the heat dissipating surface and the cooling surface on a condition that the insulating plate faces the heat dissipating surface and that the second surface faces the cooling surface. The insulating plate has an electrical insulation property and thermal conductivity. Heat generated by the heat generating body is released to the heat exchanger by performing a heat exchange between the heat dissipating surface and the cooling surface through the insulating plate. The insulating plate and the cooling surface are joined to be one body by a joining material that is made of metal and interposed between the cooling surface and the insulating plate. The heat dissipating surface and the insulating plate are in close contact with each other through an elastic member having an elastic modulus that is smaller than an elastic modulus of the joining material. The heat dissipating surface and the cooling surface are thermally connected to each other through the joining material, the insulating plate, and the elastic member.

According to this configuration, the cooling surface and the heat dissipating surface are electrically insulated since the insulating plate having an electrical insulation property is located in the heat dissipating path to be interposed between the cooling surface of the heat exchanger and the heat dissipating surface of the heat generating body. Further, in the heat dissipating path, deterioration of the thermal resistance can be suppressed by the joining material made of metal and interposed between the cooling surface and the insulating plate.

Moreover, in the heat dissipating path, the stress, which is generated in the insulating plate due to the difference of the linear expansion coefficient caused by the heat generation, can be reduced by interposing an elastic member having a small elastic modulus between the heat dissipating surface and the insulating plate. Therefore, it is not necessary to enclose the thermally connected portion with a mold resin.

Therefore, the present disclosure can bring reduction of stress generated in the insulating plate by the difference of the linear expansion and reduction of deterioration of the thermal resistance in the thermally connected portion while ensuring the insulating property between the cooling surface and the heat dissipating surface.

BRIEF DESCRIPTION OF DRAWINGS

The above and other objects, features and advantages of the present disclosure will become more apparent from the following detailed description made with reference to the accompanying drawings.

DESCRIPTION OF EMBODIMENTS

Figure 1:
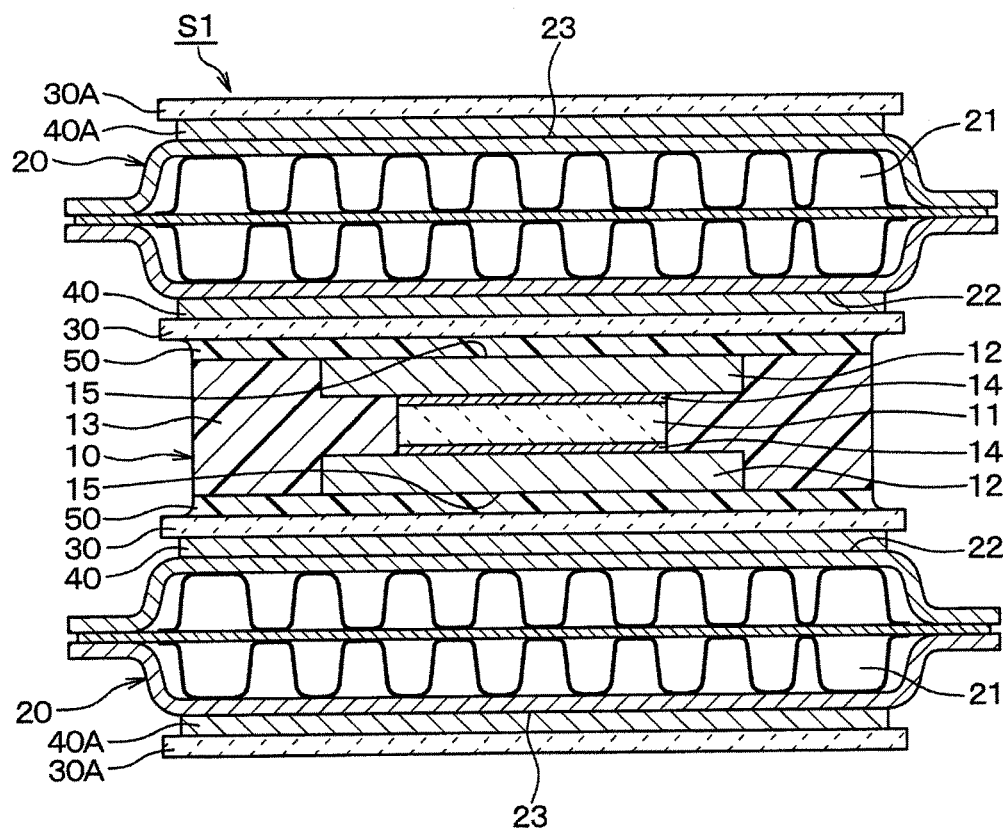
FIG. 1 is a schematic cross-sectional view illustrating a cooling module according to a first embodiment.

Embodiments of the present disclosure will be described hereinafter referring to drawings. In the embodiments, a part that corresponds to or equivalents to a matter described in a preceding embodiment may be assigned with the same reference number, and descriptions of the part may be omitted. When only a part of a configuration is described in an embodiment, another preceding embodiment may be applied to the other parts of the configuration. The parts may be combined even if it is not explicitly described that the parts can be combined. The embodiments may be partially combined even if it is not explicitly described that the embodiments can be combined, provided there is no harm in the combination.

First Embodiment

The cooling module S1 according to a first embodiment will be described with reference to FIG. 1. The cooling module S1 is, for example, mounted on a vehicle such as an automobile, and is applied to an electric power conversion device or the like in various electronic devices for a vehicle.

The cooling module S1 of the present embodiment includes a heat generating body 10, a heat exchanger 20, and an insulating plate 30. The heat generating body 10 generates heat at the time of driving or the like. The heat exchanger 20 is made of metal and exchanges heat with the heat generating body 10. The insulating plate 30 is interposed between the heat generating body 10 and the heat exchanger 20 to electrically insulate the heat generating body 10 and the heat exchanger 20 from each other.

The heat generating body 10 of the present embodiment is configured as a so-called double-sided heat dissipation type mold package. Specifically, the heat generating body 10 includes a heat generating element 11, and a heat sink 12 electrically and thermally connected to the heat generating element 11, and a mold resin 13 that seals the heat generating element 11 and the heat sink 12.

The heat generating element 11 is configured by a silicon semiconductor or the like, that is, the heat generating element 11 is configured by a power element such as a MOS transistor or an IGBT, for example. Such a heat generating element 11 is formed, e.g., as a semiconductor chip by conventional semiconductor processes.

Here, the heat sinks 12 are provided on the front and rear sides of the heat generating element 11 respectively (corresponding to the upper and lower sides of the heat generating element 11 in FIG. 1). The heat sink 12 is made of a metal having excellent heat dissipation properties such as copper (Cu) or iron (Fe), and has a plate shape to act as a heat dissipating plate and an electrode of the heat generating element 11.

On each of the front and rear sides of the heat generating element 11, one plate surface of the heat sink 12 and the heat generating element 11 are electrically and mechanically joined via a solder 14. The solder 14 can be normally employed in the mold package of this kind, and typically a lead (Pb) free solder or the like is used as the solder 14.

A stacked body, in which the heat sink 12, heat generating element 11, and the heat sink 12 are sequentially stacked, is sealed to be enclosed by the mold resin 13. The mold resin 13 is made of a typical molding material such as a polyimide or epoxy resin, and is formed by transfer molding or compression molding or the like.

Here, the plate surface of the heat sink 12 opposite to the plate surface subjected to a solder connection with the heat generating element 11 is exposed on the mold resin 13 on the front and rear sides of the heat generating element 11. The surface of the heat sink 12 exposed on the mold resin 13 is formed as a heat dissipating surface 15.

Thus, in the present embodiment, the heat generating body 10 has two heat dissipating surfaces 15 on the surfaces of the heat generating body 10. Heat of the heat generating element 11 generated at the time of driving or the like is transmitted to the heat sink 12, and is discharged to the outside of the heat generating body 10 via the heat dissipating surface 15. Thus, the heat generating body 10 of the present embodiment has the heat dissipating surfaces 15 on the front and rear sides of the heat generating element 11, i.e. on the front and rear sides of the heat generating body 10, and is configured as the double-sided heat dissipation type mold package as described above.

The heat generating body 10 is provided with a lead frame (not shown) partially sealed with the mold resin 13 similarly to this kind of mold package. The inner lead in this lead frame and the heat generating element 11 are connected by a method such as wire bonding. Further, the outer lead of the lead frame is exposed on the mold resin 13, and is electrically connectable with an external wiring member or the like.

Although it is not shown, the heat sink 12 is provided with a terminal portion that is formed with the heat sink 12 as one body and exposed on the mold resin 13. The heat generating body 10 of the present embodiment is electrically connectable with an exterior of the heat generating body 10, and thus further connectable with an exterior of the cooling module S1, by the lead frame and the terminal portion of the heat sink 12.

The heat exchanger 20 functions as a cooler that cools the heat generating body 10 by exchanging heat with the heat generating body 10. Here, the heat exchanger 20 is a so-called water-cooled heat exchanger in which a refrigerant such as water or ethylene glycol flows.

The heat exchanger 20 is made of metal such as Al (aluminum) that has a high thermal conductivity and is suitable for weight reduction. The heat exchanger 20 has a passage 21 in which the refrigerant flows, and the refrigerant is supplied to the passage 21 by a pump or the like from a tank (not shown).

According to the present embodiment, the heat exchanger 20 is provided to face each of the two heat dissipating surfaces 15, as the front and rear surfaces, of the heat generating body 10. That is, the cooling module S1 of the present embodiment has a stacked structure in which the heat generating body 10 is located between two of the heat exchangers 20.

In each of the heat exchangers 20, the surface facing the heat dissipating surface 15 of the heat generating body 10 is formed as a cooling surface 22 that is thermally connected with the heat dissipating surface 15. In other words, the cooling surface 22 cools the heat generating body 10 by exchanging heat with the heat dissipating surface 15.

Specifically, a thickness direction of the heat exchanger 20 corresponds to a vertical direction in FIG. 1, and the heat exchanger 20 has a thin rectangular parallelepiped shape having rectangular main surfaces as the front and rear surfaces. One main surface of the heat exchanger 20 facing the heat generating body 10 is the cooling surface 22. In FIG. 1, the main surface of the heat exchanger 20 on a side opposite to the cooling surface 22 is illustrated as an outer surface 23. In other words, the cooling surface of the heat exchanger 20 on a side opposite from the heat generating body 10 is the outer surface 23.

The insulating plate 30 is a plate having an electrical insulation property and thermal conductivity to ensure electrical insulation and thermal conductivity between the heat dissipating surface 15 of the heat generating body 10 and the cooling surface 22 of the heat exchanger 20. The insulating plate 30 is made of a material such as ceramics or glass, e.g., silicon nitride (SiN) of alumina ($Al_2O_3$). The insulating plate 30 may be made of an electrical insulating resin or the like, as long as an electrical insulation property and thermal conductivity are ensured as the insulating plate 30.

The insulating plate 30 is interposed between the heat dissipating surface 15 and the cooling surface 22 of the heat exchanger 20 on both the front and rear sides of the heat generating body 10. Specifically, the insulating plate 30 has one surface (i.e., first surface) and the other surface (i.e., second surface) on the front and rear sides respectively, and is arranged so that the first surface faces the heat dissipating surface 15 and that the second surface faces the cooling surface 22. In other words, the insulating plate 30 has the first surface on a side adjacent to the heat dissipating surface 15 and the second surface on a side adjacent to the cooling surface 22, and is interposed between the heat dissipating surface 15 and the cooling surface 22. The insulating plate 30 has an electrical insulation property and thermal conductivity.

Here, a joining material 40 made of metal is interposed between the cooling surface 22 of the heat exchanger 20 and the insulating plate 30, and the insulating plate 30 is joined to the cooling surface 22 to be one body by the joining material 40. In other words, the joining material 40 is interposed between the second surface of the insulating plate 30 and the cooling surface 22, thereby joining the insulating plate 30 and the cooling surface 22 integrally. The joining material 40 is typically a brazing material but may be a solder or the like.

For example, the brazing material may be Al—Cu, Al—Ag, or Al—Si, and the solder may be a Cu-containing solder that contains Cu. Thus, the insulating plate 30 is joined to the cooling surface 22 to be one body by brazing or soldering.

Figure 2:
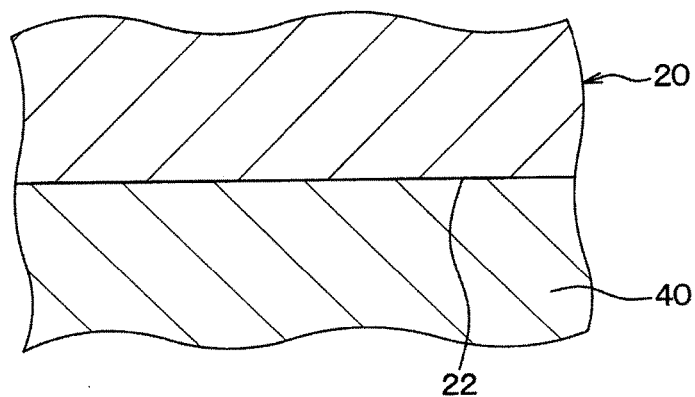
FIG. 2 is an enlarged view illustrating a boundary surface between a cooling surface of a heat exchanger and a joining material in FIG. 1.

Here, the metallic joining material 40 is a eutectic material, i.e., a eutectic portion, configured by the two metals, and is preferably joined to the cooling surface 22 as shown in FIG. 2.

The joining material 40 as the eutectic portion is joined by appropriately selecting a material that easily achieves joining by a eutectic material for the cooling surface 22 and the joining material 40. The joining between the cooling surface 22 and the joining material 40 is secured when the eutectic portion by the joining material 40 is formed, and thereby there is an advantage that a strong joining can be easily achieved. Further, when considering how and when the cooling module is broken, a brittle portion of the eutectic portion is damaged first in a case of having the eutectic portion. Accordingly, the joined insulating plate 30 itself is not damaged, and there is an advantage that a functional shutdown due to electric leakage can be prevented from occurring.

Specifically, the metal constituting the joining material 40 is typically a metal different from the metal configuring the cooling surface 22, i.e. the heat exchanger 20. The eutectic material is a eutectic mixture that is a mixture of two or more kinds of crystal that deposit simultaneously.

For example, the metal configuring the joining material 40 is Cu in a case that the metal configuring the cooling surface 22 is Al, and that the metal configuring the joining material 40 is Al—Cu. In this case, the eutectic portion is configured by eutectic Al—Cu. Further, in the case that the metal configuring the joining material 40 is Al—Cu, a thickness of a θ-phase that forms the eutectic portion of the joining material 40 is preferably 2 μm or less from the viewpoint of securing the joining property. The insulating plate 30 and the joining material 40 are required only to be joined in direct contact with each other by brazing or soldering.

An elastic member 50 having an elastic modulus smaller than that of the joining material 40, that is, an elastic member 50 softer than the joining material 40 is interposed between the heat dissipating surface 15 of the heat generating body 10 and the insulating plate 30. Accordingly, the heat dissipating surface 15 and the insulating plate 30 are in close contact with each other via the elastic member 50. In other words, the elastic member 50 has an elastic modulus that is smaller than an elastic modulus of the joining material 40, and is interposed between the first surface of the insulating plate 30 and the heat dissipating surface 15 to adhere the insulating plate 30 to the heat dissipating surface 15.

Furthermore, the elastic member 50 has a smaller elastic modulus (or Young's modulus) than that of the joining material 40, and is soft and easily deformed. The elastic member 50 having a small elastic modulus may be a heat dissipating grease including silicone resin or the like. The elastic member 50 may be a sheet made of rubber or the like as long as the elastic member 50 has usage-environmental resistance as well as elasticity.

Thus, in the cooling module S1 of the present embodiment, the heat exchanger 20, the insulating plate 30, and the heat generating body 10 are stacked via the joining material 40 and the elastic member 50. The heat dissipating surface 15 of the heat generating body 10 and the cooling surface 22 of the heat exchanger 20 are thermally connected by coming in contact with each other through the joining material 40, the insulating plate 30, and the elastic member 50.

With such a thermal connection arrangement, heat is exchanged between the heat dissipating surface 15 and the cooling surface 22 through the joining material 40, the insulating plate 30, and the elastic member 50 in the present embodiment. Therefore, the heat generated in the heat generating body 10 is dissipated to the heat exchanger 20 through the insulating plate 30, and thereby the heat generating body 10 is cooled.

Here, the cooling module S1 of the present embodiment has the stacked structure in which the heat exchanger 20, the insulating plate 30, the heat generating body 10, the insulating plate 30, and the heat exchanger 20 are stacked, and the stacked structure is held by a fixing method such as screwing or the like at unillustrated portions. Specifically, the heat exchanger 20, the insulating plate 30, and the heat generating body 10 are stacked on a condition that compressive force is applied to the stacked structure in a stacking direction (corresponding to the vertical direction in FIG. 1).

An example of the assembling method of the cooling module S1 will be described next. First, the insulating plate 30 is joined to the cooling surface 22 of the heat exchanger 20 via the joining material 40 to join the heat exchanger 20 and the insulating plate 30 integrally.

Then, the heat exchanger 20 and the heat generating body 10 are stacked on a condition that the elastic member 50 is disposed on the insulating plate 30 or the heat dissipating surface 15 of the heat generating body 10. The stacked components are fixed together by a method such as the above-described screwing. In this way, the cooling module S1 of the present embodiment is assembled.

According to the present embodiment, the insulating plate 30 having an electrical insulation property is located in the heat transfer path, i.e. the heat dissipating path, to be interposed between the cooling surface 22 of the heat exchanger 20 and the heat dissipating surface 15 of the heat generating body 10. Thus, the cooling surface 22 and the heat dissipating surface 15 are electrically insulated from each other. Further, deterioration of the thermal resistance can be suppressed in the heat dissipating path because of the metallic joining material 40 interposed between the cooling surface 22 and the insulating plate 30.

In addition, in the heat dissipating path, the stress, which is generated in the insulating plate 30 due to the difference of the linear expansion coefficient caused by the heat generation, can be reduced by the elastic member 50 that has a small elastic modulus and is interposed between the heat dissipating surface 15 and the insulating plate 30. Therefore, it is not necessary to enclose the thermally connected portion with a mold resin.

The elastic member 50 is in close contact with the heat dissipating surface 15 and the insulating plate 30 by a compressive force being applied to the cooling module S1 that has a stacked structure as described above. Therefore, the heat generating body 10 and the insulating plate 30 can be removed from each other easily, for example, by releasing the compressive force produced by a fixing member. Accordingly, only the heat generating body 10 can be easily replaced, for example, when a failure of the heat generating body 10 occurs.

Moreover, even when the heat dissipating surface 15 or the insulating plate 30 is a rough surface, to the rough surface is flattened by a deformation of the elastic member 50, and thereby the advantage such as improved adhesion between the heat dissipating surface 15 and the insulating plate 30 can be expected.

Therefore, according to the present embodiment, reduction of stress generated in the insulating plate 30 by the linear expansion difference and reduction of deterioration of the thermal resistance in the thermally connected portion can be achieved, while securing the insulation property between the cooling surface 22 of the heat exchanger 20 and the heat dissipating surface 15 of the heat generating body 10.

Further, according to the present embodiment, the heat generating body 10 is mounted on a condition that the elastic member 50 is arranged between the heat dissipating surface 15 and the insulating plate 30, after the heat exchanger 20 and the insulating plate 30 are joined together to be one body. Therefore, the assembly can be simplified as compared with the case that the assembly is operated by arranging an elastic member such as a heat dissipating grease both between the heat dissipating surface 15 and the insulating plate 30 and between the insulating plate 30 and the cooling surface 22.

In the present embodiment, as shown in FIG. 1, one surface of the heat exchanger 20 is formed as the cooling surface 22, and the insulating plate 30 is provided on the cooling surface 22. The cooling surface 22, as described above, faces the heat dissipating surface 15 of the heat generating body 10 and is thermally connected to the heat dissipating surface 15 through the joining material 40, the insulating plate 30, and the elastic member 50. Further, in FIG. 1, the surface which is positioned on the side of the heat exchanger 20 opposite from the heat generating body 10 and which is not thermally connected to the heat dissipating surface 15 is referred to as the outer surface 23.

As shown in FIG. 1, the insulating plate 30 is joined to be one body to the outer surface 23 that does not face the heat dissipating surface 15 with an outer joining material 40A made of metal. In other words, the outer joining material 40A is interposed between the outer surface 23 and an outer insulating plate 30A.

Accordingly, the cooling surface 22 of the heat exchanger 20 and the insulating plate 30 are joined together to be one body by the joining material 40, and the outer surface 23 and the outer insulating plate 30A are joined together to be one body by the outer joining material 40A. The outer insulating plate 30A is a member substantially identical to the insulating plate 30, and thus, the heat generating body 10 can be thermally connected to either the cooling surface 22 or the outer surface 23.

Thus, the outer surface 23 can be made to function as a cooling surface. In other words, either the cooling surface 22 or the outer surface 23 can be a cooling surface depending on the heating conditions of the heat generating body 10. Specifically, one of the cooling surface 22 and the outer surface 23 that are joined to the insulating plate 30 and the outer insulating plate 30A respectively is set as the cooling surface in the heat exchanger 20, and the heat generating body 10 may be connected to the one of the cooling surface 22 and the outer surface 23. For example, in the case of providing the heat generating body 10 on the outer surface 23, the outer surface 23 functions as a cooling surface, and the cooling surface 22 functions as the outer surface 23. Further, as an effect of joining the outer insulating plate 30A to the outer surface 23, a warpage of the cooling surface 22 and the outer surface 23 of the heat exchanger 20 can be reduced.

Further, according to the present embodiment, the heat generating bodies 10 can be thermally connected with both the cooling surface 22 and the outer surface 23 of the heat exchanger 20. In this case, the outer surface 23 also acts as a cooling surface, and the heat exchanger 20 may have two cooling surfaces on the front and rear sides.

The outer surface 23 of the heat exchanger 20 may be an exposed surface to which nothing is coupled. That is, only the cooling surface 22 of the heat exchanger 20 may be coupled with the insulating plate 30.

Further, in FIG. 1, the front and rear sides of the heat generating body 10 are formed as the heat dissipating surfaces 15, and two heat exchangers 20 are provided to correspond to the heat dissipating surfaces 15 respectively. However, one heat exchanger 20 may be provided to correspond to one of the two heat dissipating surfaces 15. For example, referring to FIG. 1, the heat dissipating surface 15 located on a lower side of the heat generating body 10 may be omitted, such that the heat dissipating surface 15 located on the lower side of the heat generating body 10 is exposed to an outside air.

Second Embodiment

The cooling module S2 according to the second embodiment will be described focusing on differences from the first embodiment with reference to FIG. 3. The cooling module S2 is configured by a stacked body 100 in which the heat exchanger 20, the heat generating body 10, and the heat exchanger 20 are stacked alternately as shown in FIG. 1.

According to the present embodiment, a quantity of each of the heat generating body 10 and the heat exchanger 20 is two or more. In an example shown in FIG. 3, a quantity of the heat generating body 10 is three, and a quantity of the heat exchanger 20 is four. According to the present embodiment, a quantity of the heat generating body 10 and a quantity of the heat exchanger 20 are only required to be more than one, as long as more than one of the heat generating body 10 and more than one of the heat exchanger 20 are stacked alternately to configure the stacked body 100.

That is, more than one of the heat generating body 10 is arranged in series, and more than one of the heat generating body 10 and more than one of the heat exchanger 20 are stacked alternately such that the heat exchanger 20 is interposed between each adjacent two of the heat generating bodies 10, and thereby the stacked body 100 is configured.

Here, the heat dissipating surface 15 and the cooling surface 22 are respectively a surface of the heat generating body 10 and a surface of the heat exchanger 20 facing each other, the heat generating body 10 and the heat exchanger 20 being adjacent to each other. Similar to the first embodiment, a thermal connection is made, through the joining material 40, the insulating plate 30, and the elastic member 50, between the heat dissipating surface 15 of the heat generating body 10 and the cooling surface 22 of the heat exchanger that are adjacent to each other and face each other.

In other words, more than one of the heat generating body 10 and more than one of the heat exchanger 20 are stacked alternately to configure the stacked body 100 in the cooling module S2, and more than one set of the joining material 40, the insulating plate 30, and the elastic member 50 is provided. The heat dissipating surface 15 of the heat generating body 10 and the cooling surface 22 of the heat exchanger 20 adjacent to each other are thermally connected to each other through the set of the joining material 40, the insulating plate 30, and the elastic member 50.

In this way, the cooling module S2 is configured by the stacked body 100 in which the heat generating bodies 10 and the heat exchangers 20 are disposed repeatedly. As described above, three heat generating bodies 10 and four heat exchangers 20 are repeatedly stacked in the example of FIG. 3.

Figure 3:
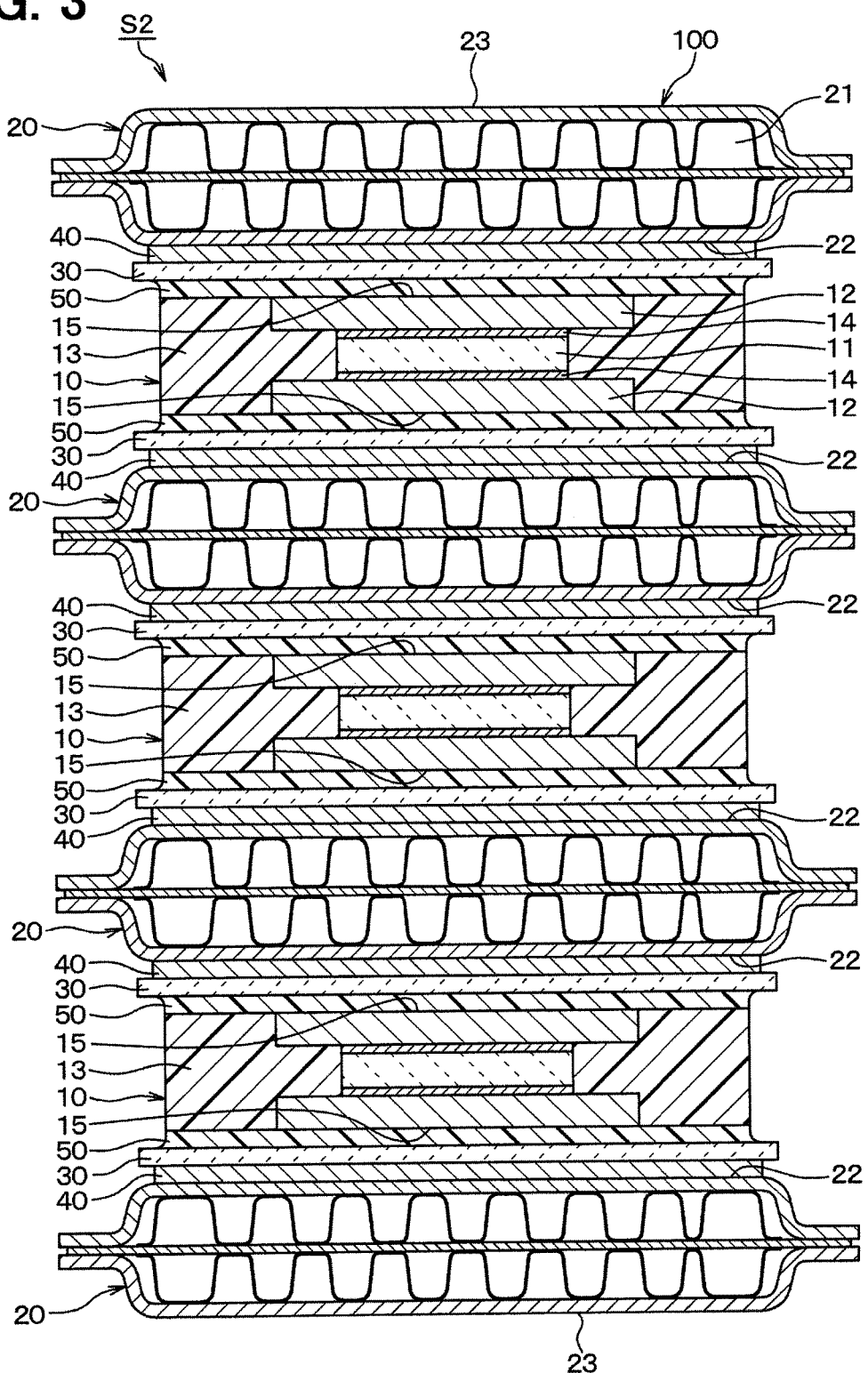
FIG. 3 is a schematic cross-sectional view illustrating a cooling module according to a second embodiment.

Here, more than one of the heat exchanger 20 includes intermediate two heat exchangers 20 other than two heat exchangers 20 located at an upper end and a lower end respectively in the example shown in FIG. 3. The heat generating body 10 is located on each of the upper side and the lower side of each of the intermediate two heat exchangers 20, such that an upper surface and a lower surface of each of the intermediate two heat exchangers 20 are provided as two cooling surface 22. Each of the cooling surfaces 22 is coupled with the insulating plate 30 integrally by the joining material 40.

Each of the two cooling surfaces 22 is coupled with the insulating plate 30, and the insulating plate 30 is in close contact with the heat dissipating surface 15 of the heat generating body 10 adjacent to the insulating plate 30. Thus, also in the present embodiment, the cooling surface 22 and the heat dissipating surface 15 are thermally connected between the heat exchanger 20 and the heat generating body 10 adjacent to each other.

Also according to the present embodiment, similar to the configuration shown in FIG. 1, the heat generating body 10 has two heat dissipating surfaces 15, and each of the two heat dissipating surfaces 15 is thermally connected to adjacent cooling surface 22 of the heat exchanger 20 through the joining material 40, the insulating plate 30, and the elastic member 50. As a result, a double-sided heat dissipation can be performed efficiently.

Furthermore, in the structure shown in FIG. 3, each of the two heat exchangers 20 located at the upper end and the lower end respectively has one surface that is thermally connectable and functions as the cooling surface 22. The heat generating body 10 is not disposed on a side adjacent to the outer surface 23 of each of the two heat exchanger 20. On the other hand, each of the intermediate two heat exchangers 20 has an upper surface and a lower surface, and both of the upper surface and the lower surface function as the cooling surface 22. Each of the intermediate two heat exchangers 20 thereby corresponds to the heat exchanger 20 that has two surfaces functioning as the cooling surface 22.

As described above, both the upper surface and the lower surface of each of the intermediate two heat exchangers 20 function as the cooling surfaces 22 in FIG. 3, that is, each of the intermediate two heat exchangers 20 has two cooling surfaces 22. However, each of the intermediate two heat exchangers 20 may have only one cooling surface 22.

For example, referring to FIG. 3, only one of the upper surface and the lower surface of each of the two heat exchangers 20 may function as the cooling surface 22. In this case, the cooling surface 22 and the heat dissipating surface 15 of the heat generating body 10 facing the cooling surface 22 may be thermally connected via the joining material 40, the insulating plate 30, and the elastic member 50 in the same manner as described above.

In this case, in each of the intermediate two heat exchangers 20, a surface facing the cooling surface 22 is not provided with the insulating plate 30, and a clearance may be formed between the surface and the heat dissipating surface 15 of the heat generating body 10 facing the surface.

Alternatively, in each of the intermediate two heat exchangers 20, the surface facing the cooling surface 22 may be provided with only the insulating plate 30 via the joining material 40, and may not be provided with the elastic member 50. In this case, in the side adjacent to the surface facing the cooling surface 22, a clearance is formed between the insulating plate 30 and the heat dissipating surface 15 of the heat generating body 10 facing the insulating plate 30.

Third Embodiment

The cooling module S3 according to a third embodiment will be described with reference to FIG. 4. The present embodiment is different from the first embodiment in that the configuration of the insulating plate 30 is modified, and this difference will be mainly described.

In the first embodiment, the insulating plate 30 is constructed as a single plate made of ceramics, glass, or the like. In contrast, according to the present embodiment, an insulating plate 30B is interposed between the heat dissipating surface 15 of the heat generating body 10 and the cooling surface 22 of the heat exchanger 20. The insulating plate 30B has a stacked structure in which two layers of a metal layer 30a and an insulating layer 30b are stacked. The metal layer 30a is stacked on a surface of the insulating layer 30b adjacent to the cooling surface 22. The insulating layer 30b is made of a material such as ceramics or glass. Specifically, as shown in FIG. 4, the insulating plate 30B has an upper surface and a lower surface, and one of the upper surface and the lower surface facing the cooling surface 22 provides the metal layer 30a.

According to the present embodiment, an electrical insulation between of the cooling surface 22 of the heat exchanger 20 and the heat dissipating surface 15 of the heat generating body 10 is secured since the insulating plate 30B has the insulating layer 30b having an electrical insulation property.

The metal layer 30a is made of metal, such as copper or aluminum, having an excellent joining property relative to the joining material 40 made of a material such as a brazing material or a solder. The metal layer 30a is provided on the surface of the insulating layer 30b by a film forming method such as sputtering, vapor deposition, plating, and brazing, and configures a surface of the insulating plate 30B adjacent to the cooling surface 22.

In the present embodiment, the joining material 40 is interposed between the cooling surface 22 of the heat exchanger 20 and the metal layer 30a of the insulating plate 30B. The joining material 40 connects the insulating plate 30 and the cooling surface 22 integrally. On the other hand, similar to the first embodiment, the heat dissipating surface 15 of the heat generating body 10 and the insulating layer 30b of the insulating plate 30B are in close contact with each other via the elastic member 50.

According to the present embodiment, a joining property between the metal layer 30a and the joining material 40 can be improved, since the metal layer 30a is located on a side of the insulating plate 30B adjacent to the cooling surface 22 that is coupled with the joining material 40 such that the metal layer 30a and the joining material 40 are coupled with each other. That is, improvement of the joining strength can be achieved by using the metal layer 30a that is more excellent in brazing or soldering than the insulating layer 30b as a joining object of the joining material 40.

Figure 4:
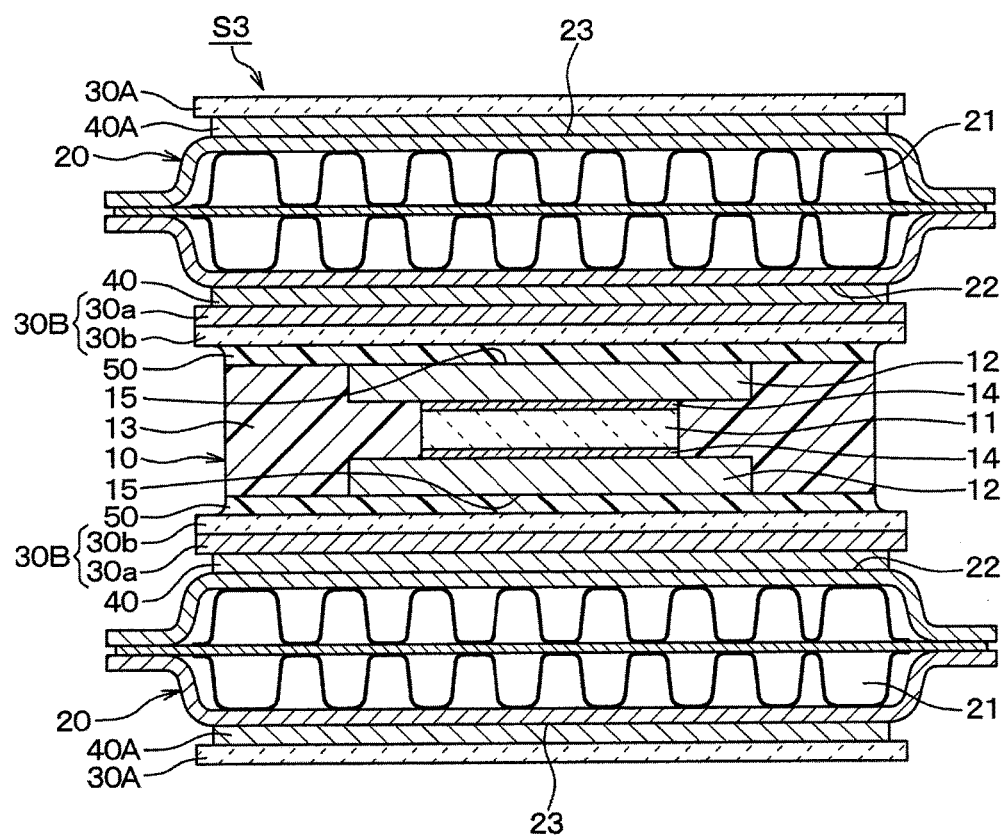
FIG. 4 is a schematic cross-sectional view illustrating a cooling module according to a third embodiment.

According to the example shown in FIG. 4, the insulating plate 30B has the metal layer 30a only on the side adjacent to the cooling surface 22 of the heat exchanger 20. However, the insulating plate 30B may have the metal layer 30a on a side adjacent to the heat dissipating surface 15 of the heat generating body 10 as well.

In this case, although it is not illustrated, the insulating plate 30B is formed as a three-layer structure in which the metal layer 30a, the insulating layer 30b, and the metal layer 30a are stacked in this order in a direction from the heat generating body 10 toward the heat exchanger 20. According to the three-layer structure, an effect that suppresses a warpage of the insulating plate 30B more certainly can be obtained as compared to a two-layer structure since the metal layer 30a is stacked on both side of the insulating layer 30b.

According to the present embodiment, similar to the example shown in FIG. 1, the outer insulating plate 30A is located on the outer surface 23 of the heat exchanger 20. The outer insulating plate 30A coupled with the outer surface 23 is configured as a single plate similar to the first embodiment. However, the outer insulating plate 30A may have the stacked structure as the insulating plate 30B.

The outer surface 23 of the heat exchanger 20 in the present embodiment may be an exposed surface to which nothing is coupled. In addition, the present embodiment may be modified such that the heat exchanger 20 is disposed on only one heat dissipating surface 15 of the heat generating body 10 located on one side of the front side and the rear side. That is, one of the heat exchangers 20, which are respectively disposed on the two heat dissipating surfaces 15 located on the front and rear sides as shown in FIG. 4, may be omitted such that one of the two heat dissipating surface 15 from which the one of the heat exchangers 20 is removed is exposed to the outside air.

Further, the present embodiment is different from the other embodiments only in that the insulating plate 30B has a stacked structure obtained by stacking the metal layer 30a and the insulating layer 30b. Therefore, similar to the second embodiment, the insulating plate 30B of the present embodiment may be adopted to the cooling module S2 configured by the stacked body 100 in which more than one of the heat generating body 10 and more than one of the heat exchanger 20 are stacked alternately.

While the present disclosure has been described with reference to preferred embodiments thereof, it is to be understood that the disclosure is not limited to the preferred embodiments and constructions. The present disclosure is intended to cover various modification and equivalent arrangements within a scope of the present disclosure. It should be understood that structures described in the above-described embodiments are preferred structures, and the present disclosure is not limited to have the preferred structures. The scope of the present disclosure includes all modifications that are equivalent to descriptions of the present disclosure or that are made within the scope of the present disclosure.

Other Modifications

In each of the above-described embodiments, the heat generating body 10 is of the double-sided heat dissipation type having the heat dissipating surface 15 on each of the front and rear sides of the heat generating element 11. However, the heat generating body 10 may have a heat dissipating surface 15 on only one side of the front and rear sides of the heat generating element 11. For example, the heat generating body 10 shown in FIG. 1 may have a package configuration in which one of the heat sinks 12 is omitted.

Further, any heat generating body is acceptable as the heat generating body 10, as long as at least one surface of which is formed as the heat dissipating surface 15, and the heat generating body 10 is not limited to the above-described mold package. For example, the heat generating body 10 may be an electronic device in which the heat generating element is mounted on one side of the wiring board, and the other surface side of the wiring board is set as a heat dissipating surface.

Any heat exchanger is acceptable as the heat exchanger 20 as long as at least one surface of which functions as the cooling surface 22, and one heat exchanger 20 may have three or more cooling surfaces 22. The heat exchanger 20 may be a fin structure of an air cooling type for example without being limited to a water cooled heat exchanger as described above.

The present disclosure is not limited to the above-described embodiments and can be modified within the scope of the present disclosure. The above-described embodiments are not unrelated to each other and can be combined with each other except for a case where the combination is clearly improper.

What is claimed is:

1. A cooling module comprising:
a heat generating body that has at least one surface as a heat dissipating surface;
a heat exchanger made of metal, the heat exchanger having at least one surface as a cooling surface facing the heat dissipating surface; and
an insulating plate that has a first surface and a second surface as a front surface and a rear surface, the insulating plate being interposed between the heat dissipating surface and the cooling surface on a condition that the insulating plate faces the heat dissipating surface and that the second surface faces the cooling surface, the insulating plate having an electrical insulation property and thermal conductivity, wherein
heat generated by the heat generating body is released to the heat exchanger by performing a heat exchange between the heat dissipating surface and the cooling surface through the insulating plate,
the insulating plate and the cooling surface are joined to be one body by a joining material, the joining material being made of metal and interposed between the cooling surface and the insulating plate,
the heat dissipating surface and the insulating plate are in direct contact with an elastic member interposed therebetween, the elastic member having an elastic modulus that is smaller than an elastic modulus of the joining material, and
the heat dissipating surface and the cooling surface are thermally connected to each other through the joining material, the insulating plate, and the elastic member.

2. A cooling module comprising:
a heat generating body having a heat dissipating surface that emits heat;
a heat exchanger made of metal and having a cooling surface that cools the heat generating body;
an insulating plate that has a first surface adjacent to the heat dissipating surface and a second surface adjacent to the cooling surface, the insulating plate being interposed between the heat dissipating surface and the cooling surface, the insulating plate having an electrical insulation property and thermal conductivity;
a joining material made of metal, the joining material being interposed between the second surface and the cooling surface and joining the insulating plate and the cooling surface integrally; and
an elastic member having an elastic modulus that is smaller than an elastic modulus of the joining material, the elastic member being interposed between the first surface of the insulating plate and the heat dissipating surface of the heat generating body and being in direct contact with both of the insulating plate and the heat dissipating surface, wherein
heat generated by the heat generating body is released to the heat exchanger through the insulating plate, and
the heat dissipating surface and the cooling surface are thermally connected to each other through the joining material, the insulating plate, and the elastic member.

3. The cooling module according to claim 1, wherein the joining material is a eutectic material configured by at least two kinds of metals.

4. The cooling module according to claim 1, wherein the heat exchanger is configured by two heat exchangers, and the heat generating body is provided between the two heat exchangers,
each of the two heat exchangers has an outer surface on a side opposite from the heat generating body, and an outer insulating plate is provided on the outer surface, and
the outer insulating plate and the outer surface are joined integrally by an outer joining material made of metal.

5. The cooling module according to claim 1, wherein more than one of the heat generating body and more than one of the heat exchanger are stacked alternately and provide a stacked body,
more than one set of the joining material, the insulating plate and the elastic member is provided, and
the heat dissipating surface of the heat generating body and the cooling surface of the heat exchanger adjacent to each other are thermally connected to each other through the set of the joining material, the insulating plate, and the elastic member.

6. The cooling module according to claim 3, wherein the joining material is configured by any one of Al—Cu, Al—Ag, and Al—Si.

7. The cooling module according to claim 6, wherein the joining material is configured by Al—Cu, and a thickness of a θ-phase that forms a eutectic portion of the joining material is 2 μm or less.

8. The cooling module according to claim 1, wherein a first surface of the elastic member is in direct contact with the heat dissipating surface and a second surface of the elastic member, opposing the first surface of the elastic member, is in direct contact with the insulating plate.

9. The cooling module according to claim 2, wherein a first surface of the elastic member is in direct contact with the heat dissipating surface and a second surface of the elastic member, opposing the first surface of the elastic member, is in direct contact with the insulating plate.

10. The cooling module according to claim 1, wherein the elastic member adheres to the heat dissipating surface and the insulating plate.

11. The cooling module according to claim 2, wherein the elastic member adheres to the heat dissipating surface and the insulating plate.

* * * * *